United States Patent
Harikai et al.

(10) Patent No.: US 10,236,266 B2
(45) Date of Patent: Mar. 19, 2019

(54) ELEMENT CHIP MANUFACTURING METHOD

(71) Applicant: Panasonic Intellectual Property Management Co., Ltd., Osaka (JP)

(72) Inventors: Atsushi Harikai, Osaka (JP); Shogo Okita, Hyogo (JP); Akihiro Itou, Kyoto (JP); Katsumi Takano, Osaka (JP); Mitsuru Hiroshima, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/594,696

(22) Filed: May 15, 2017

(65) Prior Publication Data

US 2017/0345781 A1  Nov. 30, 2017

(30) Foreign Application Priority Data

May 30, 2016  (JP) .................................. 2016-107917

(51) Int. Cl.
*H01L 21/48* (2006.01)
*H01L 21/67* (2006.01)
(Continued)

(52) U.S. Cl.
CPC .............. *H01L 24/11* (2013.01); *B44C 1/227* (2013.01); *H01L 21/4853* (2013.01); *H01L 21/67069* (2013.01); *H01L 21/68742* (2013.01); *H01L 23/49811* (2013.01); *H01L 24/13* (2013.01); *H05K 13/0465* (2013.01); *H01L 2224/11* (2013.01)

(58) Field of Classification Search
None
See application file for complete search history.

(56) References Cited

U.S. PATENT DOCUMENTS 9,437,575 B1 * 9/2016 Kelly ...................... H01L 24/97
2001/0055855 A1  12/2001 Fischer et al.
(Continued)

FOREIGN PATENT DOCUMENTS

JP  2002-093749 A  3/2002
JP  2006-245348 A  9/2006
(Continued)

*Primary Examiner* — Duy T Nguyen
*Assistant Examiner* — Bo B Jang
(74) *Attorney, Agent, or Firm* — Pearne & Gordon LLP

(57) ABSTRACT

An element chip manufacturing method includes a preparation process of preparing a substrate which includes a first surface having an exposed bump and a second surface opposite to the first surface and includes a plurality of element regions defined by dividing regions, a bump embedding process of embedding at least a head top part of the bump into the adhesive layer, a mask forming process of forming a mask in the second surface. The method for manufacturing the element chip includes a holding process of arranging the first surface to oppose a holding tape supported on a frame and holding the substrate on the holding tape, a placement process of placing the substrate on a stage provided inside of a plasma processing apparatus through the holding tape, after the mask forming process and the holding process.

6 Claims, 6 Drawing Sheets

(51) Int. Cl.
*H01L 21/687* (2006.01)
*H01L 23/498* (2006.01)
*H05K 13/04* (2006.01)
*H01L 23/00* (2006.01)
*B44C 1/22* (2006.01)

(56) References Cited

U.S. PATENT DOCUMENTS

2006/0024924 A1* 2/2006 Haji .................... H01L 21/6835
           438/464
2010/0003771 A1  1/2010 Nagai et al.
2010/0048001 A1  2/2010 Harikai et al.
2014/0335696 A1* 11/2014 Nishizaki ............ H01L 21/3065
           438/710

FOREIGN PATENT DOCUMENTS

| JP | 2009-123987 A | 6/2009 |
| JP | 2011-216513 A | 10/2011 |
| WO | 2007/148724 A1 | 12/2007 |

* cited by examiner

ELEMENT CHIP MANUFACTURING METHOD

BACKGROUND OF THE INVENTION

1. Field of the Invention

The present disclosure is related to a method for manufacturing an element chip by singulating a substrate which includes a bump.

2. Description of the Related Art

As a method for singulating a substrate including a plurality of element regions defined by dividing regions, a method (plasma dicing) for plasma etching the dividing regions to a depth which extends from one surface of the substrate to the other surface is known. The substrate, in general, includes a semiconductor layer, a circuit layer laminated on the semiconductor layer, and a projection (bump) disposed on the circuit layer and containing a metallic element such as an electrode pad (bonding pad) and a solder ball. An element chip including the circuit layer and the bump is formed by plasma etching the dividing regions of the substrate.

The plasma dicing is performed by placing the substrate on a stage installed in a plasma processing apparatus. Generally, the substrate is singulated in such a way that the semiconductor layer is placed on the stage to be opposed to the stage and plasma is irradiated from a surface side (circuit layer) on which the bump of the substrate is disposed (see PTL 1). This is because damage due to contact between the bump and the stage is prevented and a pickup of an element chip to be performed after singulation becomes easy. In PTL 1, the substrate is plasma-diced in a state where the electrode pad is exposed to a surface of the circuit layer.

CITATION LIST

Patent Literature

PTL 1: Japanese Patent Unexamined Publication No. 2002-93749

SUMMARY OF THE INVENTION

In a case where as described above, the substrate is plasma diced from the surface of the circuit layer including an exposed bump, the bump is exposed to plasma. For that reason, a metal constituting the bump is scattered. When the scattered metal is deposited to the inside of the plasma processing apparatus, generation of plasma may become unstable or the substrate which is a plasma dicing target may be contaminated with metal. When the scattered metal is deposited to the substrate again, the scattered metal becomes a fine mask (micromask) and desired etching is not conducted. The scattered metal is deposited to the substrate again or a portion of the bump is etched such that reduction in electrical device characteristics and reliability of an element chip to be obtained may be caused.

In order to suppress the bump from being irradiated with plasma, a method in which a resist mask covering the bump and including an opening in the dividing region is formed may be considered. In this case, the resist mask needs to have a sufficient thickness such that the bump is not exposed during plasma dicing. The resist mask is generally formed by performing rotary coating (spin coating) on the substrate with resist solution. In a case where the substrate having a flat surface and a thickness of T is plasma-diced, a needed film thickness M of the resist mask is at least T/R or more when R is used as a mask etch selectivity under the etching condition thereof. Generally, the mask film thickness M is set to T/R×1.1 to T/R×2.0 by taking process variations into account. Resist solution used in spin coating has flowability and thus, in a case where the bump is present in the surface of the substrate, a resist film thickness M of a head top part of the bump becomes thinner. For that reason, the resist film thickness needs to be greater than that described above such that the head top part of the bump is not exposed during the plasma dicing. Accordingly, a use amount of the resist solution is significantly increased, the time required for formation of the resist mask is increased, and production cost is increased.

The resist mask is removed by plasma ashing after the plasma dicing. When the resist mask is thick, the time required for plasma ashing becomes longer and thus, productivity is reduced. The head top part of the bump is exposed to plasma for a long time during plasma ashing and thus, the surface of the bump is easily oxidized. Accordingly, deterioration of device characteristics, for example, increase in contact resistance of the substrate is easily generated. As such, in a case where the bump is covered with the resist mask in order to suppress the bump from being irradiated with plasma, there is a problem from productivity and device characteristics point of view.

One aspect of the present disclosure is related to an element chip manufacturing method including a preparation process, a bump embedding process, a mask forming process, a holding process, a placement process, a singulation process, and a bump exposing process. The preparation process is a process of preparing a substrate which includes a first surface including an exposed bump and a second surface opposite to the first surface and includes a plurality of element regions defined by dividing regions. The bump embedding process is an embedding process of embedding at least a head top part of the bump into the adhesive layer. The mask forming process is a process of forming a mask which covers element regions in the second surface and exposes the dividing regions. The holding process is a process of arranging the first surface to oppose a holding tape supported on a frame and holding the substrate on the holding tape. The placement process is a process of placing the substrate on a stage provided inside of a plasma processing apparatus through the holding tape, after the mask forming process and the holding process. The singulation process is a process of plasma etching the dividing regions to a depth which extends from the second surface to the first surface and forming a plurality of element chips from the substrate, after the placement process. The bump exposing process is a process of peeling off the adhesive layer and re-exposing the bump after the singulation process.

According to the present disclosure, it is possible to singulate a substrate without reducing productivity while suppressing degradation or damage of a bump by plasma.

DETAILED DESCRIPTION OF EMBODIMENTS

Figure 1A:
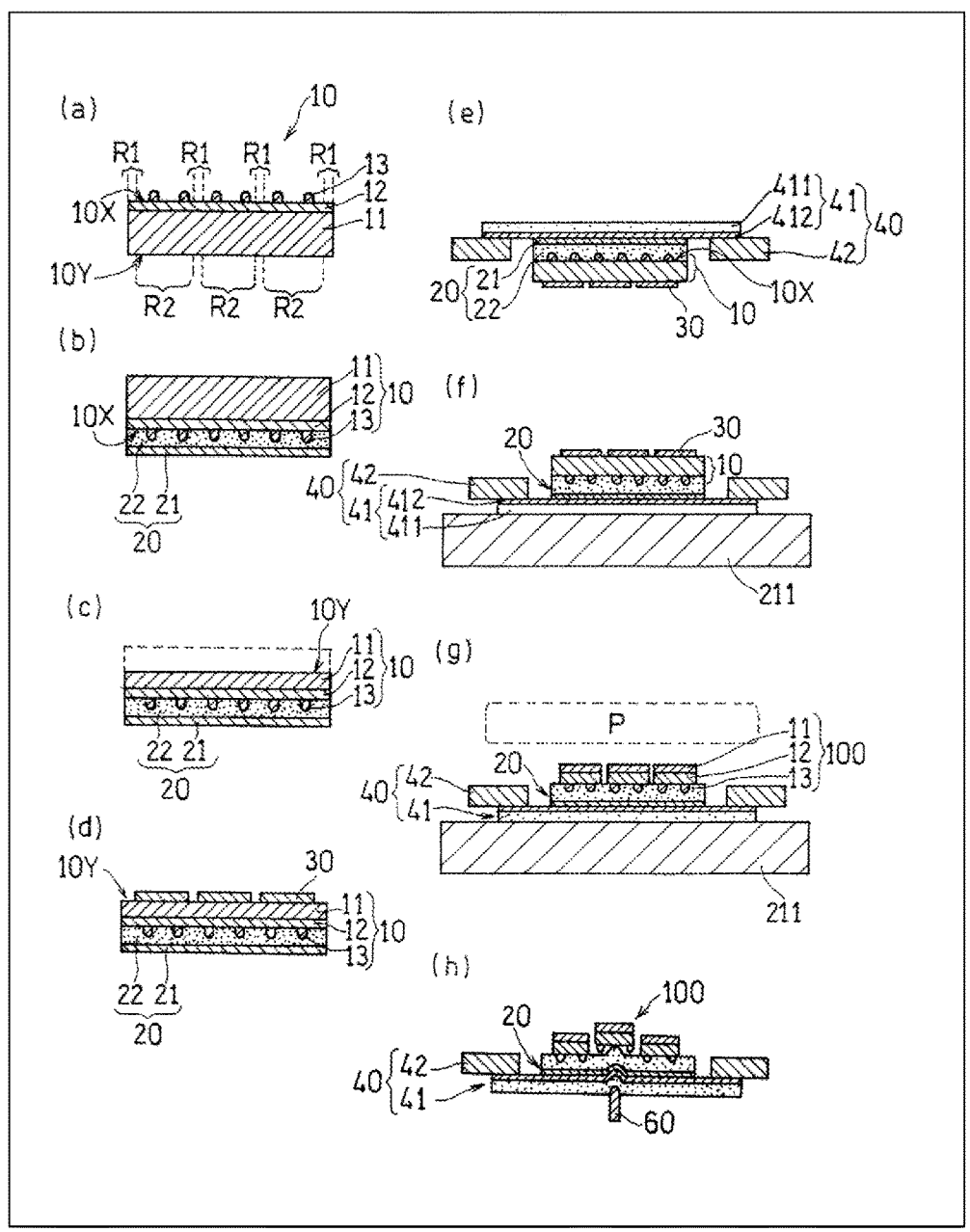
FIG. 1A is a conceptual diagram illustrating an element chip manufacturing method according to a first exemplary embodiment of the present disclosure using a cross section of a substrate.

In the present exemplary embodiment, an element chip is manufactured by a method including a preparation process, a bump embedding process, a mask forming process, a holding process, a placement process, a singulation process, and a bump exposing process. The preparation process is a process of preparing a substrate which includes a first surface including an exposed bump and a second surface opposite to the first surface and includes a plurality of element regions defined by dividing regions. The bump embedding process is an embedding process of embedding at least a head top part of the bump into the adhesive layer. The mask forming process is a process of forming a mask which covers an element region in the second surface and exposes the dividing regions. The holding process is a process of arranging the first surface to oppose a holding tape supported on a frame and holding the substrate on the holding tape. The placement process is a process of placing the substrate on a stage provided inside of a plasma processing apparatus through the holding tape, after the mask forming process and the holding process. The singulation process is a process of plasma etching the dividing regions to a depth which extends from the second surface to the first surface and forming a plurality of element chips from the substrate, after the placement process. The bump exposing process is a process of peeling off the adhesive layer and re-exposing the bump after the singulation process.

The substrate is plasma-diced from a surface (second surface) opposite to a first surface which includes the bump. For that reason, the bump is hardly exposed to plasma. With this, the following effects are achieved.

First Effect
Stabilization of Plasma Generation

When the bump is exposed to plasma, a metal constituting the bump may be scattered. In a case where the plasma processing apparatus includes an inductive coupled plasma source and has a dielectric member which transmits a magnetic field for plasma generation, when the metal (gold, silver, nickel or the like) with inferior reactivity constituting the bump is deposited to the dielectric member, transmission of the magnetic field for plasma generation is blocked. With this, generation of plasma becomes unstable and reproducibility and stability of etching is reduced. However, according to the present exemplary embodiment, even in a case where the plasma processing apparatus includes the dielectric member, the metal is suppressed from being deposited to the dielectric member and thus, generation of plasma is stable and reproducibility and stability of etching is enhanced.

Second Effect
Making a Favorable Shape for an Element Chip

When the metal constituting the bump is deposited to the substrate again, a negative influence is exerted on the shape of the element chip, for example, the metal becomes a micromask during the plasma dicing and a side surface of the element chip is roughened or the like. The negative influence on the shape of the element chip may cause reduction in flexural strength of the element chip or molding failure when packaging the element chip. However, according to the present exemplary embodiment, the micromask is hardly formed by the metal during the plasma dicing and thus, an element chip excellent in smoothness of the side surface is obtained. Accordingly, an element chip to be obtained is excellent in flexural strength and the molding failure is hard to occur when packaging elements in the element chip.

Third Effect
Suppression of Etching Residue and Etching Stop

When the metal constituting the bump is scattered and deposited to the dividing region of the substrate again, etching residue is generated on the dividing region. Such an etching residue becomes the cause of particles generation and induces defective recognition and pickup failure in a pickup process after the plasma dicing. For that reason, yield in production is reduced. When an amount of etching residue generated in the dividing region is large, etching stop is generated in the dividing region and deterioration that the substrate cannot be singulated is generated. However, according to the present exemplary embodiment, the metal is hardly re-deposited to the substrate during the plasma dicing and thus, etching residue is suppressed from being generated in the dividing region. Accordingly, an amount of particles is reduced and recognition performance and pickup performance is increased, and yield in production is enhanced in a pickup process after the plasma dicing. The etching stop is hardly generated in the dividing region during the plasma dicing and the yield is enhanced.

Fourth Effect
Suppression of Metal Contamination of the Element Chip

When the metal constituting the bump is scattered and is re-deposited to a portion (for example, a surface of a resin protective layer on a surface of the circuit layer and a side surface of the semiconductor layer) other than the bump of the element chip, metal contamination of the element chip occurs. When the element chip is contaminated by metal, device characteristics are reduced. However, according to the present exemplary embodiment, the metal is suppressed from being re-deposited to the portion other than the bump of the element chip and thus, metal contamination of the element chip is hard to occur and device characteristics of the element chip is enhanced.

Fifth Effect
Prevention of Bump-Etching

When a portion of the bump is etched, electrical characteristics of the element chip may be changed. However, according to the present exemplary embodiment, the bump is prevented from being etched and thus, the electrical characteristics of the element chip is hardly changed.

Sixth Effect
Prevention of Bump Degradation

When the bump is exposed to plasma, the bump may change in quality (degradation) such that deterioration occurs. For example, in a case where the bump contains copper, when plasma processing using gas containing sulfur hexafluoride ($SF_6$) is performed, copper is sulfurized with plasma irradiation and reliability is reduced. In a case where process gas or ashing gas contains fluorine or oxygen, an increase in contact resistance or a decrease in connection strength occurs by fluorination or oxidation of the surface of the bump, and reliability is reduced. In a case where process gas contains fluorocarbon such as $C_4F_8$, a reaction product which contains carbon is deposited to the surface of the bump, an increase in contact resistance or a decrease in connection strength occurs, and reliability is reduced. However, according to the present exemplary embodiment, the bump is hardly degraded during plasma dicing. Accordingly, even in a case where any kind of gas is used, reliability is hardly imp aired.

Seventh Effect
Prevention of Bump Damage

According to the present exemplary embodiment, a substrate is placed on a stage in a state where at least the head top part of the bump is protected in the adhesive layer during plasma dicing. For that reason, damage of the bump caused by contact of the bump with the stage is suppressed. The substrate is plasma diced from the second surface and thus, the mask which covers the element region is formed on the second surface. For that reason, the bump exposed to the first surface is hardly influenced by a developer or the like used in formation of the mask. Accordingly, damage of the bump is suppressed also in the mask forming process.

Eighth Effect
Omission of Thick Resist Mask

In a case where a thick resist mask is formed on the substrate as described above in order to protect the bump, plasma ashing for a long time is needed for removal of the resist mask after plasma dicing. For that reason, the processing time is increased or deterioration of the device characteristics, for example, the head top part of the bump is oxidized by being exposed to plasma in plasma ashing, and contact resistance is increased when electrical connection is performed become easy to occur. However, in the present exemplary embodiment, plasma dicing is performed from a surface opposite to the circuit layer and thus, the thick resist mask described above is not needed and an increase in manufacturing cost can be suppressed. Also, ashing for a long time for removal of the resist mask is omitted and thus, the increase of the processing time or deterioration of the device characteristics described above is hard to occur.

In the following, with reference to the accompanying drawings, description will be made on a first exemplary embodiment in which the thinning process, the mask forming process, the holding process, and the singulation process are performed in a state where a protection tape is adhered to the first surface and a second exemplary embodiment in which the mask forming process is performed in a state where the protection tape is adhered to the first surface and the protection tape is peeled off from the first surface before the holding process.

First Exemplary Embodiment

Figure 1B:
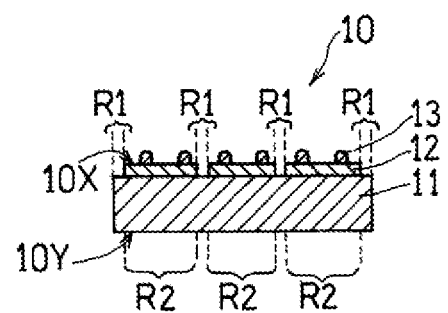
FIG. 1B is a cross-sectional view illustrating another example of the substrate used in the first exemplary embodiment.
Figure 1C:
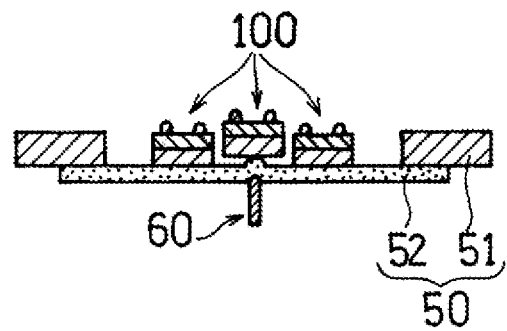
FIG. 1C is a conceptual diagram illustrating another example of a bump exposing process conducted in the first exemplary embodiment using the cross section of the substrate.
Figure 2:
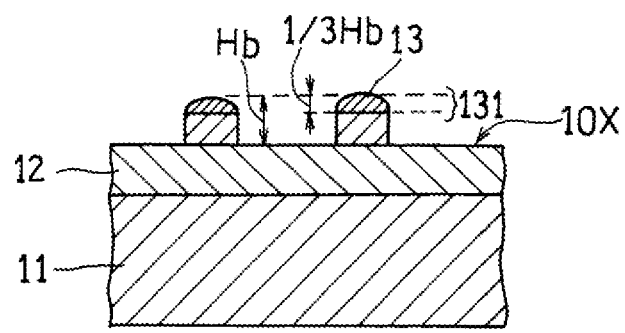
FIG. 2 is a cross-sectional view schematically illustrating a configuration of a substrate according to an exemplary embodiment of the present disclosure.
Figure 3A:
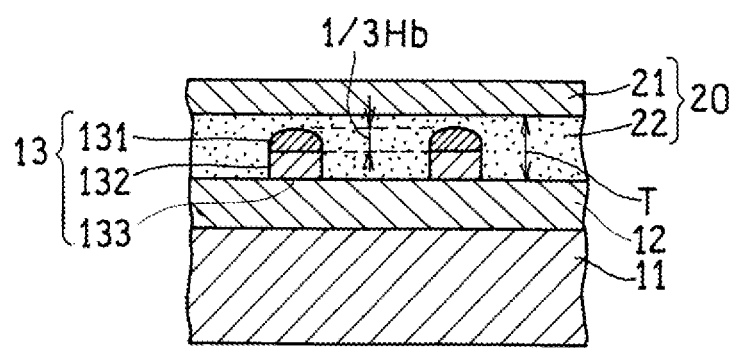
FIG. 3A is a cross-sectional view schematically illustrating a laminated structure formed with the substrate and a protection tape in the embedding process of the first exemplary embodiment.
Figure 3B:
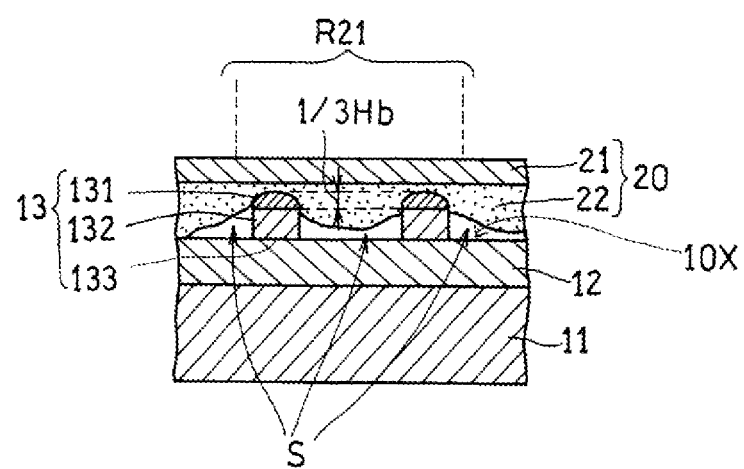
FIG. 3B is a cross-sectional view schematically illustrating another laminated structure formed with the substrate and the protection tape in the embedding process of the first exemplary embodiment.
Figure 4A:
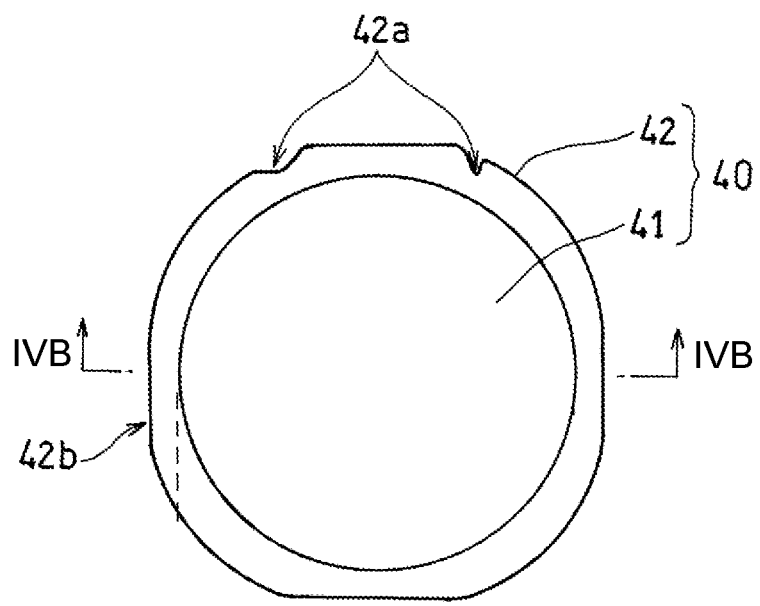
FIG. 4A is a top view schematically illustrating a transport carrier according to the exemplary embodiment of the present disclosure.
Figure 4B:
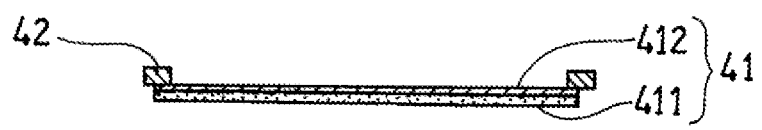
FIG. 4B is a cross-sectional view taken along line IVB-IVB of FIG. 4A.
Figure 5:
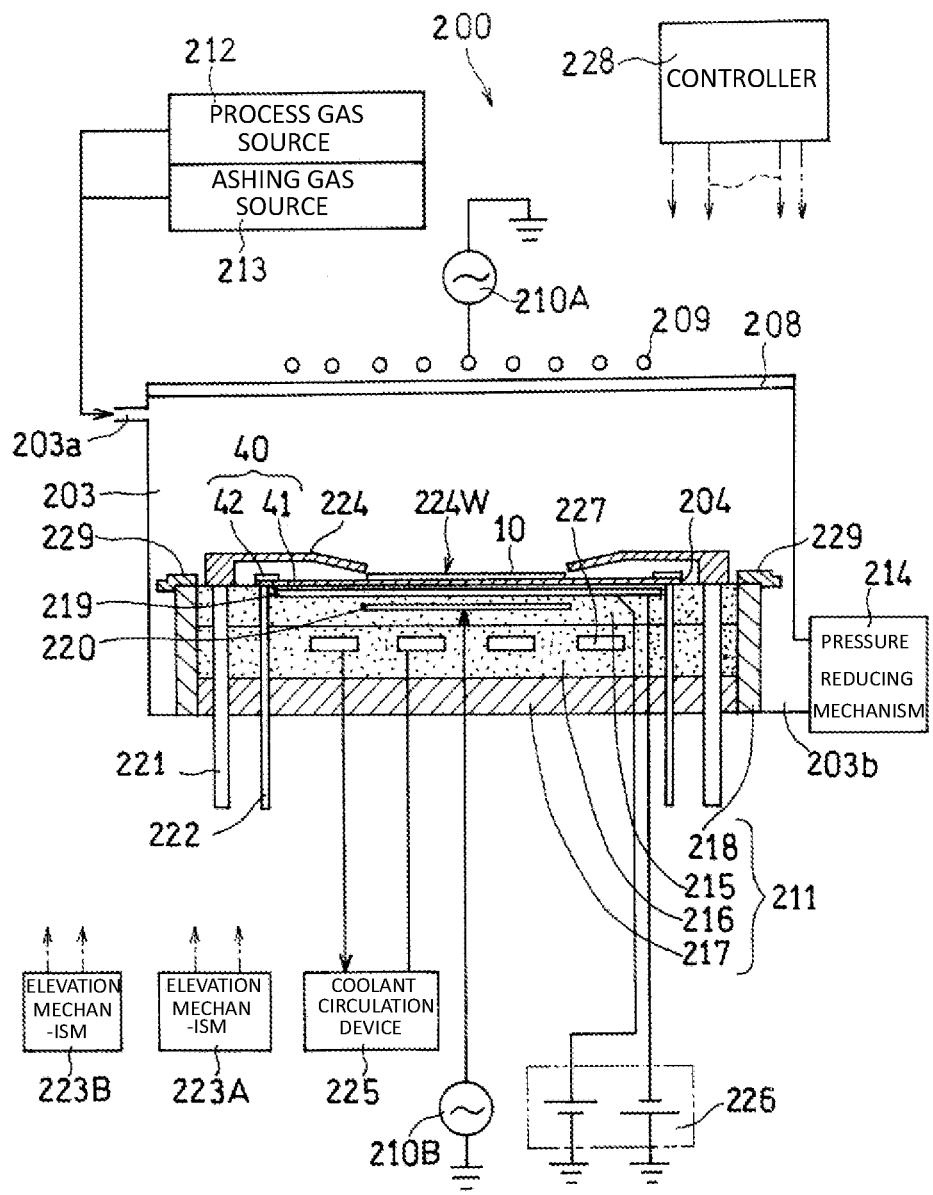
FIG. 5 is a conceptual diagram illustrating a schematic structure of a plasma processing apparatus according to an exemplary embodiment of the present disclosure using a cross-section.

In the present exemplary embodiment, a bump embedding process is performed by adhering a protection tape having an adhesive layer to a first surface. A manufacturing method according to the present exemplary embodiment will be described with reference to FIG. 1A to FIG. 5. (a) to (h) of FIG. 1A are conceptual diagrams illustrating a manufacturing method according to the present exemplary embodiment using a cross section of a substrate. FIG. 1B is a cross-sectional view illustrating another example of the substrate used in the present exemplary embodiment. FIG. 1C is a conceptual diagram illustrating another example of a bump exposing process conducted in the present exemplary embodiment using a cross section of the substrate. FIG. 2 is a cross-sectional view schematically illustrating a configuration of the substrate (before thinning process) according to the present exemplary embodiment. FIG. 3A is a cross-sectional view schematically illustrating a laminated structure formed with the substrate and the protection tape in an embedding process of the present exemplary embodiment. FIG. 3B is a cross-sectional view schematically illustrating another laminated structure formed with the substrate and the protection tape in the embedding process of the present exemplary embodiment. FIG. 4A is a top view schematically illustrating a transport carrier according to the present exemplary embodiment. FIG. 4B is a cross-sectional view taken along line IVB-IVB of FIG. 4A. FIG. 5 is a conceptual diagram illustrating a schematic structure of a plasma processing apparatus according to the present exemplary embodiment using a cross-section. In the illustrated examples, for convenience's sake, same reference numerals are given to members having the same function.

(1) Preparation Process

First, substrate 10 which becomes a singulation target is prepared ((a) of FIG. 1A). Substrate 10 includes first surface 10X and second surface 10Y, and also semiconductor layer 11, circuit layer 12 laminated on a first surface 10X side of semiconductor layer 11, and a plurality of bumps 13 disposed on circuit layer 12. Substrate 10 is partitioned into dividing regions R1 and a plurality of element regions R2 defined by dividing regions R1. Dividing regions R1 of substrate 10 are etched to thereby obtain element chips 100 each of which includes semiconductor layer 11, circuit layer 12, and bump 13.

In prepared substrate 10, semiconductor layer 11 may be exposed in dividing regions R1 as illustrated in FIG. 1B. That is, circuit layer 12 may be separated into a plurality of portions according to element regions R2. Separation of circuit layer 12 may be performed in a process that forms circuit layer 12 and may be performed with laser scribing, mechanical dicing, or the like before the preparation process after circuit layer 12 is formed. As such, in a case where circuit layer 12 of prepared substrate 10 is separated, etching of circuit layer 12 is not needed in the singulation process and thus, productivity is enhanced. Substrate 10 is apt to warp by internal stresses possessed by circuit layer 12 in the thinning process. When substrate 10 is warped, cooling of substrate 10 becomes insufficient during plasma dicing and it is difficult to conduct a desired plasma dicing. In a case where the thinning process is performed on substrate 10 including circuit layer 12 separated in advance, internal stress that becomes the cause of warping is relaxed. Accordingly, it becomes easy to suppress warping of substrate 10.

The size of substrate 10 is not particularly limited and the maximum diameter of substrate 10 is, for example, approximately 50 to 300 mm. Also the shape of substrate 10 is not particularly limited and is, for example, a circular shape and a square shape. An orientation flat or a notched part such as a notch (both are not illustrated) may be provided in substrate 10.

Semiconductor Layer

Semiconductor layer 11 contains, for example, silicon (Si), gallium arsenide (GaAs), gallium nitride (GaN), and silicon carbide (SiC). The thickness of semiconductor layer 11 after the thinning process which will be described later is not particularly limited, is, for example, 20 to 1000 μm, or and may be 100 to 300 μm.

Circuit Layer

Circuit layer 12 includes, for example, an insulation film, a metal layer, a resin protective layer (for example, polyimide), and a resist layer and constitutes a semiconductor circuit, an electronic component element, a MEMS, or the like. The thickness of circuit layer 12 is not particularly limited and is, for example, 10 to 100 μm.

Bump

Bump 13 is a projection containing a metal, for example, an electrode pad and a solder ball. Metals contained in bump 13 are not particularly limited and includes, for example, copper, an alloy of copper, tin, and silver, an alloy of silver and tin, an alloy of tin and lead, gold, aluminum, and an aluminum alloy. As will be described later, bump 13 is not directly exposed to plasma and thus, various metals can be used according to purposes without having to worry about degradation of a metal or a chemical change. The shape of bump 13 is not also particularly limited and may be a square pillar, a cylindrical pillar, a mound shape, a ball shape and the like. Height Hb (see FIG. 2) of bump 13 may be suitably set according to purposes and is, for example, 20 to 200 μm. Height Hb of bump 13 has the maximum height of bump 13 in the normal direction of semiconductor layer 11. A disposition and the number of bumps are not particularly limited and are suitably determined according to purposes.

(2) Bump Embedding Process

Next, at least head top part 131 of bump 13 is embedded into first adhesive layer 22 ((b) of FIG. 1A). With this, damage of bump 13 is suppressed in the thinning process to be subsequently performed. Head top part 131 of bump 13 is embedded into first adhesive layer 22 by adhering protection tape 20 including first adhesive layer 22 to first surface 10X. Protection tape 20 may be pressurized after being adhered to first surface 10X. Particularly, protection tape 20 is adhered to bump 13 while being pressurized and heated in the vacuum to thereby make bump 13 easily embedded into first adhesive layer 22.

Protection Tape

Protection tape 20 includes, for example, base material 21 and first adhesive layer 22. Base material 21 is a support of first adhesive layer 22. As the material of base material 21, for example, polyester such as polyethylene terephthalate and polyimide are included. The thickness of base material 21 is not particularly limited, but preferably 30 to 150 μm from the point of view of handleability and functionality as a support.

First adhesive layer 22 preferably has flexibility enough to follow along at least head top part 131 of bump 13. Additionally, first adhesive layer 22 preferably has peelability enough to be peeled off from first surface 10X without damaging or peeling off bump 13. From a peelability point of view, an adhesive force between bump 13 and first adhesive layer 22 is preferably smaller than an adhesive force between bump 13 and circuit layer 12. First adhesive layer 22 preferably has the heat resistance enough to withstand a temperature condition (for example, baking conditions (150° C. for approximately 5 minutes) in forming a resist mask) in subsequent processes.

Such first adhesive layer 22 is formed by a laminate structure of, for example, a layer containing acrylic resin (acrylic resin layer) and a layer containing silicone resin (silicone resin layer). In this case, an acrylic resin layer is disposed on a base material 21 side. From the flexibility point of view, a thickness of the acrylic resin layer is preferably larger than that of the silicone resin layer. Particularly, the thickness of the acrylic resin layer is preferably 5 to 20 times the thickness of the silicone resin layer. First adhesive layer 22 may be formed with, for example, ultraviolet curable resin (for example, a mixture of acrylic resin, a photopolymerizable oligomer, and a photopolymerization initiator). In this case, first adhesive layer 22 is irradiated with ultraviolet ray such that protection tape 20 is easily peeled off from substrate 10.

Thickness T (see FIG. 3A) of first adhesive layer 22 is not particularly limited as long as at least head top part 131 of bump 13 is capable of being embedded into first adhesive layer 22. Head top part 131 of bump 13, as illustrated in FIG. 2, is a portion occupying a range extending from the top of bump 13 to a point which corresponds to one-third height Hb of bump 13. That is, a thickness of first adhesive layer 22 is not particularly limited as long as the thickness is greater than or equal to one-third height Hb of bump 13. Particularly, from a bump 13 protection point of view, thickness T of first adhesive layer 22 is preferably greater than height Hb of bump 13. On the other hand, from a cost point of view, thickness T of first adhesive layer 22 is preferably less than or equal to twice height Hb of bump 13. Specifically, thickness T of first adhesive layer 22 is 40 to 400 μm and may be 100 to 300 μm. For example, in a case where height Hb of bump 13 is 65 μm, thickness T of first adhesive layer 22 may be 115 μm. In this case, a thickness of base material 21 is, for example, 50 μm. Thickness T of first adhesive layer 22 is an average thickness of first adhesive layer 22 in the normal direction of semiconductor layer 11.

As illustrated in FIG. 3A, bump 13 may be embedded into first adhesive layer 22 in such a way that a surface in head top part 131 and a surface of a portion (that is, base 132) other than head top part 131 of bump 13 as well as other than contact part 133 of bump 13 which is in contact with first surface 10X are covered by first adhesive layer 22. With this, damage or change in quality of bump 13 is further suppressed in the thinning process, the mask forming process, and the singulation process. In this case, thickness T of first adhesive layer 22 is greater than height Hb of bump 13.

On the other hand, the surface of base 132 of bump 13 may not be covered by first adhesive layer 22. For example, as illustrated in FIG. 3B, bump 13 may be embedded into first adhesive layer 22 in such a way that void S surrounded by base 132, first adhesive layer 22, and first surface 10X is formed in a region (narrow pitch region R21) between adjacent bumps 13 in element region R2. In this case, a contact area between the surface of bump 13 and first adhesive layer 22 is small and thus, first adhesive layer 22 is peeled off more smoothly and damage or peeling off of bump 13 is further suppressed in the subsequent bump exposing process. However, it is desirable that first adhesive layer 22 and first surface 10X are in close contact with each other in dividing region R1. With this, bump 13 is hardly exposed to chemical liquid such as a developer or plasma and thus, damage or degradation of bump 13 is suppressed in the thinning process, the mask forming process, and the singulation process.

(3) Thinning Process

Next, a thinning process ((c) of FIG. 1A) for polishing a portion of semiconductor layer 11 to make semiconductor layer 11 thinner is performed. This is because a thickness of semiconductor layer 11 to be provided to the singulation process needs to be small from a viewpoint of reduction of the processing time or miniaturization of an element chip or the like in the singulation process, while a certain level of thickness is required for semiconductor layer 11 in forming circuit layer 12 on semiconductor layer 11. The thinning process is performed in a state where protection tape 20 is adhered to first surface 10X.

In the thinning process, a surface (second surface 10Y) of a side opposite to circuit layer 12 of semiconductor layer 11 is ground and substrate 10 is made thinner to a desired thickness. During the thinning process, bump 13 is protected by protection tape 20. The type of grinding apparatus is not particularly limited and includes, for example, a back grinder provided with a diamond wheel or the like. After the thinning process, a polishing process may be performed on second surface 10Y. Before and after the thinning process, a surface of a side opposite to first surface 10X is referred to as second surface 10Y.

(4) Mask Forming Process

In the present process, mask 30 which covers element region R2 and exposes dividing region R1 is formed ((d) of FIG. 1A). Mask 30 is formed by removing photosensitive resin corresponding to dividing region R1 by the photolithography method, after forming a photosensitive resin layer on, for example, second surface 10Y, by a spin coating method. The photosensitive resin layer may be adhered to second surface 10Y after being formed into a film shape. In replacement of photosensitive resin, mask 30 may be formed by being subjected to patterning by laser scribing after forming a heat-resistant resin layer such as a polyimide resin layer on second surface 10Y. From a workability point of view, mask 30 is preferably formed by excluding a region spanning from an outer peripheral edge of second surface 10Y to a position spaced inwardly 3 mm therefrom.

(5) Holding Process

In the present process, substrate 10 is adhered to holding tape 41 to be held such that first surface 10X opposes holding tape 41 supported on frame 42 ((e) of FIG. 1A). Substrate 10 is held on holding tape 41 to thereby enhance handleability in the subsequent singulation process and the bump exposing process. In this case, substrate 10 is adhered to holding tape 41 through first adhesive layer 22. In the following, frame 42 and holding tape 41 fixed to frame 42 may be collectively referred to as transport carrier 40.

Holding Tape

Holding tape 41 is not particularly limited. Holding tape 41 includes, for example, support 411 and second adhesive layer 412. A material of support 411 is not particularly limited and includes, for example, a film (resin film) containing thermoplastic resin such as polyolefin such as polyethylene and polypropylene and polyester such as polyethylene terephthalate. In the resin film, a rubber component (for example, ethylene-propylene rubber (EPM) and ethylene-propylene-diene rubber (EPDM)) for adding stretchability, a plasticizer, a softner, an antioxidant, various kinds of additives such as a conductive material may be blended. The thermoplastic resin may have a functional group which exhibits photopolymerization reaction such as an acrylic group. The thickness of support 411 is not particularly limited and is, for example, 50 to 300 µm and preferably 50 to 150 µm.

Second adhesive layer 412 preferably contains an adhesion component (for example, ultraviolet curing type acrylic adhesive agent) of which an adhesive force is reduced by ultraviolet (UV) irradiation. This is because element chip 100 is easily peeled off from second adhesive layer 412 and the picking up becomes easy by performing UV irradiation when element chip 100 is picked up. The thickness of second adhesive layer 412 is not particularly limited, but is preferably 5 to 100 µm, more preferably 5 to 15 µm from an adhesiveness or cost point of view.

Frame

Frame 42 is a frame includes an opening having an area equal to or larger than the entirety of substrate 10 illustrated in FIG. 4A, and has a predetermined width and substantially fixed thin thickness. The frame 42 has such a degree of rigidity to be able to transport holding tape 41 and substrate 10 in a state where holding tape 41 and substrate 10 are held. As illustrated in FIG. 4B, second adhesive layer 412 is placed to oppose frame 42 and the outer peripheral edge of second adhesive layer 412 is adhered to one surface of frame 42 to thereby fix holding tape 41 to frame 42. A shape of the opening of frame 42 is not particularly limited and may be, for example, a circular shape, a rectangular shape, and a polygon such as a hexagon. Frame 42 may be provided with notch 42a or corner cut 42b for positioning. The materials of frame 42 include, for example, metal such as aluminum or stainless steel and resin.

First surface 10X of substrate 10 is adhered to a portion exposed from the opening of frame 42 of second adhesive layer 412 through protection tape 20. That is, protection tape 20 is not peeled off and substrate 10 is adhered to holding tape 41 through protection tape 20. For that reason, load on bump 13 according to peeling off of protection tape 20 is reduced and damage or contamination due to external factors of circuit layer 12 and bump 13 is reduced. Furthermore, protection tape 20 is not peeled off and thus, enhancement of productivity can be expected.

In the singulation process, in a case where substrate 10 is placed on stage 211 such that head top part 131 of bump 13 opposes stage 211, bump 13 may be damaged. However, protection tape 20 (back grinding tape) used for suppressing damage of bump 13 in the thinning process is not peeled off and is diverted, as it is, to be used in the subsequent singulation process such that damage of bump 13 is suppressed in the singulation process. For that reason, a dicing tape generally used for applications can be used in holding tape 41 which is used for holding substrate 10 without the need of a functionality for protecting bump 13. That is, it is possible to realize the present exemplary embodiment in which plasma is irradiated from second surface 10Y to singulate substrate 10 by using the back grinding tape and dicing tape used conventionally. Accordingly, element chip 100 in which damage of bump 13 is suppressed is obtained while suppressing cost increase.

In the holding process, substrate 10 is preferably held on holding tape 41 after being placed on a stand (not illustrated). Substrate 10 is placed on the stand such that second surface 10Y opposes the stand and second adhesive layer 412 is adhered to first surface 10X of substrate 10 through protection tape 20. A surface of the stand is preferably covered by fluororesin (polytetrafluoroethylene, polyvinylidene fluoride, tetrafluoroethylene-ethylene copolymer, or the like). With this, even in a case where the surface of the stand comes in contact with mask 30 formed on second surface 10Y of substrate 10, peeling off of mask 30 is easily suppressed.

The mask forming process and the holding process are performed in any order whatever. The holding process may be conducted after the mask forming process and the mask forming process may be conducted after the holding process. In a case where the holding process is conducted after the mask forming process, it is possible to use a general resist coating apparatus or exposing apparatus for substrate-processing in forming the mask. On the other hand, in a case where the mask forming process is conducted after the holding process, it is necessary to use a resist coating apparatus or exposing apparatus which can handle frame 42. This is because the mask is formed for the transport carrier which holds substrate 10 as a target. However, the latter case is preferable in that in the holding process, contact of the surface of the stand and mask 30 formed on second surface 10Y can be avoided and thus deformation of mask 30 can be suppressed. Furthermore, the surface of the stand is hardly contaminated and thus, a maintenance frequency of the stand is reduced.

(6) Placement Process

After the mask forming process and the holding process, substrate 10 is placed on stage 211 provided inside the plasma processing apparatus through protection tape 20 and holding tape 41.

In the following, description will be specifically made on plasma processing apparatus 200 used in the plasma etching process and the plasma dicing process with reference to FIG. 5, but a plasma processing apparatus is not limited thereto. FIG. 5 schematically illustrates a cross-section of a structure of plasma processing apparatus 200 used in present exemplary embodiment.

Plasma processing apparatus 200 is provided with stage 211. Transport carrier 40 is placed on stage 211 such that the surface of holding tape 41 on which substrate 10 is held faces upward. Cover 224, which includes window portion 224W for covering at least a portion of frame 42 and holding tape 41 and exposing at least a portion of substrate 10, is disposed above stage 211.

Stage 211 and cover 224 are disposed inside vacuum chamber 203. Vacuum chamber 203 has a substantially cylindrical shape of which the upper part is opened and the upper opening is closed by dielectric member 208 which is a lid. As materials for constituting vacuum chamber 203, aluminum, stainless steel (SUS), aluminum of which surface is subjected to the alumite treatment, and the like may be exemplified. As materials for constituting dielectric member 208, dielectric materials such as yttrium oxide ($Y_2O_3$), aluminum nitride (AlN), alumina ($Al_2O_3$), quartz ($SiO_2$) or the like may be exemplified. Antenna 209 as an upper electrode is disposed above dielectric member 208. Antenna 209 is electrically connected with first high frequency power source 210A. Stage 211 is disposed on the bottom side within vacuum chamber 203.

Gas introduction port 203a is connected to vacuum chamber 203. Process gas source 212 which is a supply source of process gas and ashing gas source 213 are respectively connected to gas introduction port 203a by pipes. Vacuum chamber 203 is provided with exhaust port 203b and pressure reducing mechanism 214, which includes a vacuum pump exhausting gas within vacuum chamber 203, is connected to exhaust port 203b.

Stage 211 is provided with electrode layer 215, metal layer 216, base 217 supporting electrode layer 215 and metal layer 216, and outer periphery 218 surrounding electrode layer 215, metal layer 216, and base 217, each of which has a circular shape. Outer periphery 218 is constituted with metals having conductivity and etching resistance and protects electrode layer 215, metal layer 216, and base 217 from plasma. On the upper surface of outer periphery 218, annular ring shaped outer peripheral ring 229 is disposed. Outer peripheral ring 229 is for protecting the upper surface of outer periphery 218 from plasma. Electrode layer 215 and outer peripheral ring 229 are constituted with, for example, dielectric materials described above.

An electrode portion (in the following, referred to as ESC electrode 219) constituting an electrostatic attraction mechanism and high frequency electrode portion 220 electrically connected to second high frequency power source 210B are disposed inside electrode layer 215. DC power source 226 is electrically connected to ESC electrode 219. The electrostatic attraction mechanism is constituted with ESC electrode 219 and DC power source 226.

Metal layer 216 is constituted with, for example, aluminum of which surface is subjected to alumite coating. Coolant flow path 227 is formed inside metal layer 216. Coolant flow path 227 cools down stage 211. Stage 211 is cooled down and accordingly, holding tape 41 placed on stage 211 is cooled down and cover 224 of which a portion is in contact with stage 211 is also cooled down. With this, substrate 10, protection tape 20 and holding tape 41 are suppressed from being damaged when substrate 10, protection tape 20 and holding tape 41 are heated during plasma processing. Coolant within coolant flow path 227 is circulated by coolant circulator 225.

A plurality of supporting portions 222 which penetrate through stage 211 are disposed in the vicinity of outer periphery of stage 211. Supporting portions 222 are driven to be moved up and down by elevation mechanism 223A. When transport carrier 40 is transported into vacuum chamber 203, transport carrier 40 is handed over to supporting portions 222 raised to a predetermined position. Supporting portions 222 support frame 42 of transport carrier 40. An upper end surface of supporting portions 222 is lowered to a level which is equal to or less than the level of stage 211 such that transport carrier 40 is placed on a predetermined position on stage 211.

A plurality of elevation rods 221 are connected to an end portion of cover 224 and cover 224 is able to be moved up and down. Elevation rods 221 are driven to be moved up and down by elevation mechanism 223B. Moving up and down operations of cover 224 by elevation mechanism 223B can be performed independently from elevation mechanism 223A.

Controller 228 controls operations of elements constituting plasma processing apparatus 200 which includes first high frequency power source 210A, second high frequency power source 210B, process gas source 212, ashing gas source 213, pressure reducing mechanism 214, coolant circulator 225, elevation mechanism 223A, elevation mechanism 223B, and an electrostatic attraction mechanism.

In the placement process, first, substrate 10 held in transport carrier 40 is carried into vacuum chamber 203. Cover 224 is moved up to a predetermined position within vacuum chamber 203 by driving elevation rod 221. A gate valve (not illustrated) is open and transport carrier 40 is carried into vacuum chamber 203. A plurality of supporting portions 222 are on standby in a state of being moved up. When transport carrier 40 reaches a predetermined position above stage 211, transport carrier 40 is handed over to supporting portions 222. Transport carrier 40 is handed over to the top surface of supporting portions 222 in such a way that second adhesive layer 412 of holding tape 41 faces upward.

When transport carrier 40 is handed over to supporting portions 222, the gate valve is closed and vacuum chamber 203 is placed in a sealed state. Next, supporting portions 222 is started to move down. The top surface of supporting portions 222 is moved down to a level which is equal to or less than the level of stage 211 such that transport carrier 40 is placed on stage 211. Subsequently, elevation rod 221 is driven. Elevation rod 221 moves cover 224 down to a predetermined position. In this case, a distance between cover 224 and stage 211 is adjusted so as to make it possible for cover 224 to cover frame 42 without coming into contact with transport carrier 40. With this, frame 42 and a portion of holding tape 41 at which substrate 10 is not held are covered by cover 224 without coming into contact with each other and substrate 10 is exposed from window portion 224W of cover 224.

Cover 224 is doughnut-shaped having, for example, a substantially circular external contour and has a fixed width and a thin thickness. An inner diameter (diameter of window portion 224W) of cover 224 is smaller than that of frame 42 and an outer diameter of cover 224 is larger than that of frame 42. Accordingly, when transport carrier 40 is placed at a predetermined position of stage 211 and cover 224 is moved down, cover 224 can cover at least a portion of holding tape 41 and frame 42. At least a portion of substrate 10 is exposed from window portion 224W. In this case, cover 224 does not contact with any of frame 42, holding tape 41, and substrate 10. Cover 224 is constituted with, for example, a dielectric material such as ceramics (for example, alumina and aluminum nitride) or quarts, or metal such as aluminum or aluminum of which surface is subjected to the alumite treatment.

After transport carrier 40 is handed over to supporting portions 222, a voltage is applied from DC power source 226 to ESC electrode 219. With this, holding tape 41 comes in contact with stage 211 and is electrostatically sucked onto stage 211 at the same time. Application of the voltage to ESC electrode 219 may be started after holding tape 41 is placed on stage 211 (after being come into contact therewith).

(7) Singulation Process

After the placement process, the dividing regions R1 of substrate 10 are plasma etched to a depth which extends from second surface 10Y to first surface 10X in a state where substrate 10 is placed on stage 211 to form a plurality of element chips 100 from substrate 10 ((g) of FIG. 1A).

In this case, substrate 10 is placed on stage 211 in such a way that second surface 10Y on which bumps 13 are not disposed faces antenna 209 which is a plasma source. That is, plasma etching is performed in a state where bump 13 is suppressed from being irradiated with plasma. At least head top part 131 of bump 13 is embedded into first adhesive layer 22 to be protected. For that reason, effects described may be obtained. Additionally, semiconductor layer 11 is made thin and thus, plasma irradiation time onto substrate 10 is reduced in the singulation process and degradation and damage of bump 13 due to plasma is further suppressed.

A plasma generation condition is set according to materials of a layer to be etched (semiconductor layer 11 and circuit layer 12) or the like. In the present process, semiconductor layer 11 and circuit layer 12 of which materials are different from each other are etched and thus, it is preferable that plasma etching is performed by switching to the condition according to each layer. For example, after semiconductor layer 11 is removed by a Bosch process which will be described later, circuit layer 12 may be removed by plasma in which process gas containing Ar is used as raw material.

In the Bosch process, semiconductor layer 11 is vertically etched in a depth direction. In a case where semiconductor layer 11 contains Si, a protective film deposition step, a protective film etching step, and Si etching step are sequentially repeated to excavate semiconductor layer 11 in the depth direction, in the Bosch process.

The protective film deposition step is performed, for example, under the processing condition that a pressure inside vacuum chamber 203 is adjusted to 15 to 25 Pa, electric power of 1500 to 2500 W is input to antenna 209 from first high frequency power source 210A, and electric power of 0 to 50 W is input to high frequency electrode portion 220 from second high frequency power source 210B, for 2 to 15 seconds, while supplying $C_4F_8$ of 150 to 250 sccm as raw material gas. Here, sccm is a unit of gas flow rate. 1 sccm is a flow rate indicating that gas at 0° C. and 1 atmosphere of pressure (under the standard state) flows by 1 $cm^3$ for 1 minute.

The protective film etching step is performed, for example, under the processing condition that a pressure inside vacuum chamber 203 is adjusted to 5 to 15 Pa, electric power of 1500 to 2500 W is input to antenna 209 from first high frequency power source 210A, and electric power of 300 to 1000 W is input to high frequency electrode portion 220 from second high frequency power source 210B, for 2 to 10 seconds, while supplying $SF_6$ of 200 to 400 sccm as raw material gas.

The Si etching step is performed, for example, under the processing condition that a pressure inside vacuum chamber 203 is adjusted to 5 to 15 Pa, electric power of 1500 to 2500 W is input to antenna 209 from first high frequency power source 210A, and electric power of 50 to 500 W is input to high frequency electrode portion 220 from second high frequency power source 210B, for 10 to 20 seconds, while supplying $SF_6$ of 200 to 400 sccm as raw material gas.

Under the conditions described above, the protective film deposition step, the protective film etching step, and the Si etching step are repeated to thereby make it possible to vertically etch semiconductor layer 11 containing Si in the depth direction at a rate of 10 μm/min.

In a case where circuit layer 12 contains a metal, the plasma etching is performed, for example, under the condition that a pressure inside vacuum chamber 203 is adjusted to 0.2 to 1.5 Pa, high frequency electric power of 1500 to 2500 W having a frequency of 13.56 MHz is input to antenna 209 from first high frequency power source 210A, and high frequency electric power of 500 to 1800 W having a frequency of 100 kHz or more (for example, 400 to 500 kHz or 13.56 MHz) is input to high frequency electrode portion 220 from second high frequency power source 210B, while supplying mixed gas of $CF_4$ and Ar ($CF_4$:Ar=1:4) of 150 to 250 sccm as raw material gas.

After substrate 10 is singulated, ashing is performed. First, process gas (for example, oxygen gas and mixed gas containing oxygen gas and gas containing fluorine) for ashing is introduced into vacuum chamber 203 from ashing gas source 213. On the other hand, vacuum chamber 203 is exhausted by pressure reducing mechanism 214 to maintain a pressure inside vacuum chamber 203 to a predetermined pressure. Oxygen plasma is generated within vacuum chamber 203 due to input of the high frequency power from first high frequency power source 210A and mask 30 on the surface of substrate 10 (element chip 100), which is exposed from window portion 224W of cover 224 and singulated, is removed.

Ashing is performed, for example, under the condition that a pressure inside vacuum chamber 203 is adjusted to 5 to 30 Pa, electric power of 1500 to 2500 W is input to antenna 209 from first high frequency power source 210A, and electric power of 0 to 300 W is input to high frequency electrode portion 220 from second high frequency power source 210B, while supplying mixed gas of $CF_4$ and $O_2$ ($CF_4$:$O_2$=1:100) of 200 to 500 sccm as raw material gas.

When ashing is ended, gas inside vacuum chamber 203 is exhausted and the gate valve is open. Transport carrier 40 holding a plurality of element chips 100 is carried out from plasma processing apparatus 200 by a transport mechanism which enters from the gate valve. When transport carrier 40 is carried out, the gate valve is closed quickly. A carrying out process of transport carrier 40 may be performed in a reverse procedure to the procedure for placing substrate 10 described above on stage 211. That is, after cover 224 is moved up to a predetermined position, suction of transport carrier 40 onto stage 211 is released by making an application voltage to ESC electrode 219 zero and supporting portions 222 are moved up. After supporting portions 222 are moved up to a predetermined position, transport carrier 40 is carried out.

(8) Bump Exposing Process

After the singulation process, first adhesive layer 22 is peeled off and bump 13 is exposed again. The bump exposing process may be a portion of a pickup process of element chip 100 ((h) of FIG. 1A).

Pickup of element chip 100 is performed by pushing singulated element chip 100 together with protection tape 20 up from a holding tape 41 side by push-up pin 60. With this, first adhesive layer 22 is peeled off from first surface 10X. Accordingly, at least a portion of element chip 100 is also raised and bump 13 is exposed and thus, the pickup of element chip 100 becomes possible. In this case, bump 13 is covered by protection tape 20 and holding tape 41 and thus, damage by push-up pin 60 is avoided. As described above, according to the present exemplary embodiment, etching residue is hardly generated in the dividing regions during the plasma dicing process. Accordingly, recognition accuracy and pickup performance are enhanced in the pickup process and thus, yield in production is also enhanced.

As illustrated in FIG. 1C, the pickup of element chip 100 may be performed after first adhesive layer 22 (protection tape 20) and holding tape 41 are peeled off from first surface 10X and pickup tape 52 is adhered to second surface 10Y. In this case, circuit layer 12 and bump 13 surface the upper surface and thus, accuracy of recognizing element chip 100 is enhanced and pickup failure is reduced.

Pickup tape 52 is preferably fixed to pickup frame 51 from a handleability point of view, similar to holding tape 41. Pickup frame 51 may have the material and shape similar to those of frame 42. The material of pickup tape 52 may be the same as that of holding tape 41. On the other hand, holding tape 41 and pickup tape 52 may be formed with materials according to respective purposes. For example, flexibility suitable for pickup is required for holding tape 41 and a film including resin with high crystallinity can be used for holding tape 41. Such a resin film is excellent in heat resistance and plasma resistance. That is, holding tape 41 excellent in plasma resistance can be used in the singulation process. For that reason, it is possible to perform, for example, the plasma dicing while inputting a high-frequency power of 100 kHz or more (for example, 400 to 500 kHz, or 13.56 MHz) to high frequency electrode portion 220 and applying a high bias voltage. With this, high speed processing is possible and productivity is enhanced.

Element chip 100 capable of being obtained by a manufacturing method of the present exemplary embodiment is excellent in smoothness of a side surface thereof. This is because, as described above, during the plasma dicing, metals constituting bump 13 are suppressed from being redeposited to substrate 10. Such element chip 100 is excellent in flexural strength and molding failure is hard to occur in packaging. The electrical characteristics of element chip 100 are hardly degenerated. This is because in the plasma dicing, bump 13 is prevented from being etched and the metals described above are suppressed from being redeposited to substrate 10.

Even in a case where bump 13 contains copper and process gas containing sulfur hexafluoride ($SF_6$) is used in the plasma dicing, element chip 100 capable of being obtained is excellent in reliability. This is because copper contained in bump 13 is hardly sulfurized. Similarly, even in a case where process gas used in the plasma dicing or ashing gas contains fluorine or oxygen, fluorination or oxidation of the surface of bump 13 is hard to occur. Even in a case where process gas used in the plasma dicing contains fluorocarbon such as $C_4F_8$, a reaction product containing carbon is hardly deposited to the surface of bump 13. For that reason, it is possible to obtain element chip 100 in which an increase in contact resistance or a decrease in connection strength of bump 13 is suppressed and which has high reliability can be obtained.

Second Exemplary Embodiment

Figure 6:
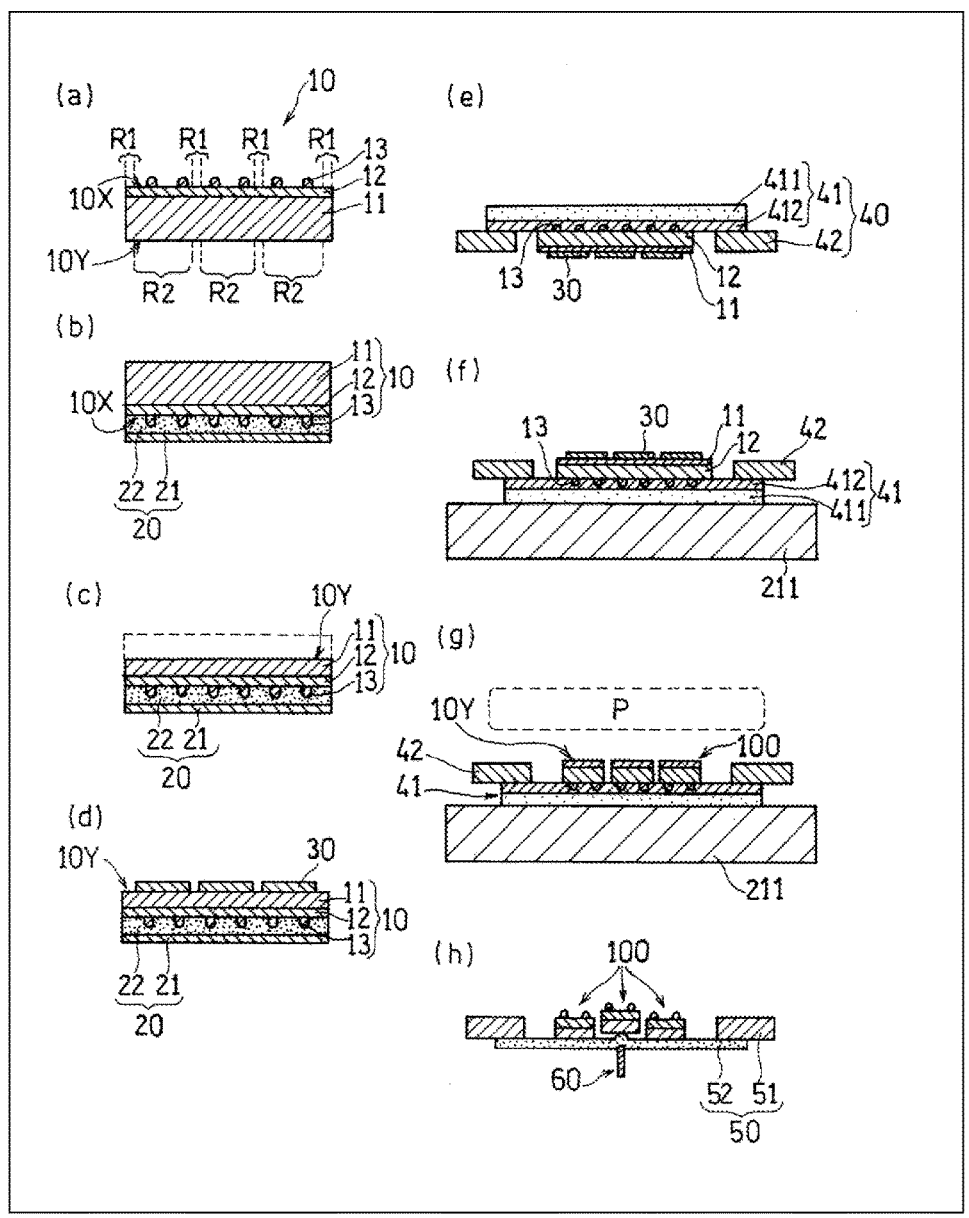
FIG. 6 is a conceptual diagram illustrating an element chip manufacturing method according to a second exemplary embodiment of the present disclosure using a cross-section of a substrate.

The present exemplary embodiment is similar to the first exemplary embodiment except that except that after the mask forming process, protection tape 20 is peeled off from first surface 10X and holding tape 41 is adhered to first surface 10X so as to embed bump 13 into second adhesive layer 412 of holding tape 41. In FIG. 6, a manufacturing method of an element chip of the present exemplary embodiment is illustrated ((a) to (h)). (a) to (d) and (h) of FIG. 6 respectively correspond to (a) to (d) of FIG. 1A and FIG. 1C.

In the present exemplary embodiment, after the mask forming process ((d) of FIG. 6), protection tape 20 is peeled off from first surface 10X and holding tape 41 supported on frame 42 is adhered to first surface 10X so as to embed at least head top part 131 of bump 13 into second adhesive layer 412 of holding tape 41 ((e) of FIG. 6). That is, the bump embedding process and the holding process are conducted at the same time. With this, the processes are simplified and productivity is enhanced. In this case, second adhesive layer 412 has a thickness enough to embed at least head top part 131 of bump 13. Second adhesive layer 412 preferably has the same configuration as first adhesive layer 22 described above. Protection tape 20 may be peeled off before the mask forming process.

In the placement process, substrate 10 is placed on stage 211 through holding tape 41 ((f) of FIG. 6). For that reason, substrate 10 is easily cooled down compared to the first exemplary embodiment in which substrate 10 is placed on stage 211 through holding tape 41 and protection tape 20. Also, in the present exemplary embodiment, plasma is irradiated from second surface 10Y ((g) of FIG. 6) and thus, degradation and damage of bump 13 are suppressed.

The pickup process (bump exposing process) may be performed by transferring substrate 10 onto pickup tape 52 ((h) of FIG. 6) or may be performed in a state where element chip 100 is held in holding tape 41. In the former case, a layer on which element chip 100 is held becomes thinner compared to the first exemplary embodiment and thus, element chip 100 is easily pushed upward.

In the exemplary embodiment according to the present disclosure, degeneration and damage of the bump is suppressed and thus, the exemplary embodiment may be useful as a method for singulating the substrate provided with the bumps to manufacture the element chip.

What is claimed is:

1. An element chip manufacturing method comprising:
   a preparation process of preparing a substrate which includes a first surface including an exposed bump and a second surface opposite to the first surface and includes a plurality of element regions defined by dividing regions;
   a bump embedding process of embedding at least a head top part of the bump into an adhesive layer;
   a mask forming process of forming a mask which covers the element regions in the second surface and exposes the dividing regions;
   a holding process of arranging the first surface to oppose a holding tape supported on a frame and holding the substrate on the holding tape;
   a placement process of placing the substrate on a stage provided inside of a plasma processing apparatus through the holding tape, after the mask forming process and the holding process;
   a singulation process of plasma etching the dividing regions to a depth which extends from the second surface to the first surface and forming a plurality of element chips from the substrate, after the placement process; and
   a bump exposing process of peeling off the adhesive layer and re-exposing the bump after the singulation process,
   wherein in the holding process, an inner peripheral surface of the frame is opposed to side surfaces of the adhesive layer with a gap between the frame and the adhesive layer.

2. The element chip manufacturing method of claim 1,
   wherein the bump embedding process is performed by adhering a protection tape having the adhesive layer to the first surface, and
   in the holding process, the substrate is held on the holding tape in such a way that the first surface faces the holding tape through the protection tape.

3. The element chip manufacturing method of claim 1,
   wherein a thickness of the adhesive layer is greater than a height of the bump.

4. The element chip manufacturing method of claim 3,
   wherein, in the bump embedding process, a surface of the head top part of the bump and a surface of the bump other than the head top part come in contact with the adhesive layer.

5. The element chip manufacturing method of claim 1,
   wherein, a void is formed in the bump embedding process, the void being surrounded by (i) a surface of the bump that is other than the head top part and that is other than a portion at which the bump is in contact with the first surface, (ii) the adhesive layer, and (iii) the first surface.

6. The element chip manufacturing method of claim 1,
   wherein the substrate includes a semiconductor layer and a circuit layer laminated on a first surface side of the semiconductor layer and including the bump, and
   in the preparation process, the substrate in which the semiconductor layer is exposed in the dividing regions is prepared.

* * * * *